United States Patent
Miyazaki

(10) Patent No.: US 10,641,832 B2
(45) Date of Patent: May 5, 2020

(54) BATTERY PACK UNIT TESTING METHOD AND TESTING APPARATUS

(71) Applicant: TOYOTA JIDOSHA KABUSHIKI KAISHA, Toyota-shi, Aichi (JP)

(72) Inventor: Motoki Miyazaki, Toyota (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 0 days.

(21) Appl. No.: 15/265,107

(22) Filed: Sep. 14, 2016

(65) Prior Publication Data
US 2017/0074942 A1    Mar. 16, 2017

(30) Foreign Application Priority Data

Sep. 15, 2015   (JP) ................................. 2015-181431
Sep. 13, 2016   (JP) ................................. 2016-178998

(51) Int. Cl.
| | | |
|---|---|---|
| *G01R 31/385* | (2019.01) | |
| *H01M 10/34* | (2006.01) | |
| *H01M 10/44* | (2006.01) | |
| *H01M 10/48* | (2006.01) | |
| *H01M 10/42* | (2006.01) | |

(Continued)

(52) U.S. Cl.
CPC ......... *G01R 31/385* (2019.01); *G01R 31/396* (2019.01); *H01M 10/345* (2013.01); *H01M 10/4285* (2013.01); *H01M 10/44* (2013.01); *H01M 10/446* (2013.01); *H01M 10/486* (2013.01); *H01M 10/6556* (2015.04); *H02J 7/007192* (2020.01); *H02J 7/087* (2013.01)

(58) Field of Classification Search
USPC .................................. 320/103, 112, 134, 150
See application file for complete search history.

(56) References Cited

U.S. PATENT DOCUMENTS

| | | | |
|---|---|---|---|
| 6,204,639 B1 * | 3/2001 | Takano ................. | H02J 7/0003 320/150 |
| 2003/0027037 A1 * | 2/2003 | Moores, Jr. ............. | B25F 5/008 429/82 |

(Continued)

FOREIGN PATENT DOCUMENTS

| | | |
|---|---|---|
| JP | 2006-294336 A | 10/2006 |
| JP | 2012-517662 A | 8/2012 |
| JP | 2014-192124 A | 10/2014 |

OTHER PUBLICATIONS

Kondo Hironari, Battery Pack, Jun. 10, 2014; JP2014-192124.*

*Primary Examiner* — Nasima Monsur
(74) *Attorney, Agent, or Firm* — Sughrue Mion, PLLC

(57) ABSTRACT

An inventive testing method is intended for testing a battery pack unit including: a battery pack including a plurality of cells electrically connected to each other; and a duct assembly through which a coolant is supplied to the cells of the battery pack. The testing method includes: a) charging the battery pack under predetermined conditions while supplying the coolant to the duct assembly; b) acquiring temperature information on the cells at predetermined time intervals during step a); and c) determining whether a difference between the highest and lowest ones of the temperatures of the cells measured at substantially the same time is equal to or greater than a predetermined reference temperature difference on the basis of the temperature information acquired in step b).

8 Claims, 4 Drawing Sheets

(51) Int. Cl.
*G01R 31/396* (2019.01)
*H01M 10/6556* (2014.01)
*H02J 7/08* (2006.01)
*H02J 7/00* (2006.01)

(56) References Cited

U.S. PATENT DOCUMENTS

| | | | |
|---|---|---|---|
| 2003/0118891 A1* | 6/2003 | Saito | B60L 1/003 |
| | | | 429/62 |
| 2004/0004461 A1* | 1/2004 | Hamada | H01M 2/1016 |
| | | | 320/112 |
| 2004/0257089 A1* | 12/2004 | Aridome | H01M 10/486 |
| | | | 324/430 |
| 2006/0196954 A1* | 9/2006 | Okuda | H01M 10/486 |
| | | | 236/49.3 |
| 2010/0185405 A1* | 7/2010 | Aoshima | B60L 3/0046 |
| | | | 702/63 |
| 2011/0042058 A1* | 2/2011 | Kikuchi | B60H 1/00278 |
| | | | 165/287 |
| 2011/0104547 A1* | 5/2011 | Saito | H01M 2/1077 |
| | | | 429/120 |
| 2011/0129716 A1* | 6/2011 | Chung | H01M 2/1077 |
| | | | 429/120 |
| 2012/0028087 A1 | 2/2012 | Gaben et al. | |
| 2014/0152260 A1* | 6/2014 | LePort | H02J 7/0029 |
| | | | 320/118 |

* cited by examiner

BATTERY PACK UNIT TESTING METHOD AND TESTING APPARATUS

BACKGROUND OF THE INVENTION

1. Field of the Invention

The present teaching relates to battery pack unit testing methods and testing apparatuses. This application is based on and claims priority to Japanese Patent Application Nos. 2015-181431 filed Sep. 15, 2015 in Japan and 2016-178998 filed Sep. 13, 2016 in Japan, the contents of which are incorporated herein by reference.

2. Description of the Related Art

For example, JP 2006-294336 A discloses a battery pack unit including a cooling device equipped with a duct assembly through which a coolant is supplied to each cell of the battery pack unit. In this publication, this battery pack unit is referred to as a "battery pack". The battery pack unit disclosed in this publication includes the duct assembly including an inner suction duct for coolant supply, and an inner discharge duct for coolant discharge. These ducts are built into a case of the battery pack unit.

SUMMARY OF THE INVENTION

A battery pack unit including a cooling device equipped with a coolant supply duct assembly may develop trouble, such as a malfunction of the cooling device. The cooling device may malfunction, for example, in the following situations: where the duct assembly is not attached to the cooling device during manufacturing; where the duct assembly is improperly attached to the cooling device; and where a portion of a duct is clogged with foreign substances or particles and thus the duct assembly malfunctions. Accordingly, the inventor provides a method for testing whether a battery pack unit including a cooling device equipped with a coolant supply duct assembly functions properly.

A testing method according to an embodiment of the teaching is intended for testing a battery pack unit including: a battery pack including a plurality of cells electrically connected to each other; and a duct assembly through which a coolant is supplied to the cells of the battery pack. The testing method includes: a) charging the battery pack under predetermined conditions while supplying the coolant to the duct assembly; b) acquiring temperature information on the cells at predetermined time intervals during step a); and c) determining whether a difference between the highest and lowest ones of temperatures of the cells measured at substantially the same time is equal to or greater than a predetermined reference temperature difference on the basis of the temperature information acquired in step b). This testing method detects a failure in the duct assembly.

According to another embodiment of the teaching, step a) may involve starting the charging of the battery pack after the coolant is supplied to the duct assembly. Thus, the cooling of the battery pack starts before the charging of the battery pack, reducing temperature differences between the cells prior to the start of the charging. This results in an increase in testing accuracy.

According to still another embodiment of the teaching, the charging of the battery pack in step a) may be performed at some time between completion of assembly of the battery pack unit and shipment of the battery pack unit. In this case, because the cells of the battery pack unit do not degrade before shipment, charging-induced temperature rises of the cells occur in substantially the same way. Thus, the duct assembly is more accurately tested for a failure. According to yet another embodiment of the teaching, the charging of the battery pack in step a) may be initial charging of the battery pack. In this case, the cells of the battery pack unit are fresh in testing the battery pack unit, thus enabling more accurate testing.

According to still yet another embodiment of the teaching, the reference temperature difference in step c) may be set to be between 1.7° C. and 2.3° C. inclusive. If the testing method is carried out in different temperature environments and/or the initial temperatures of battery pack units serving as test objects differ, temperature rise variations of the cells will be kept within about 1.2° C. as long as the duct assembly functions properly. In contrast, if the duct assembly malfunctions, temperature rise variations of the cells will be about 3° C. Accordingly, the reference temperature difference in step c) is set to be between 1.7° C. and 2.3° C. inclusive, thus enabling accurate detection of an abnormality caused by a malfunction of the duct assembly.

According to another embodiment of the teaching, the testing method may further include d) detecting an abnormality in the battery pack on the basis of charging-dependent information on the cells of the battery pack other than the temperature information on the cells of the battery pack. Consequently, an abnormality in the duct assembly is detected with higher accuracy.

According to still another embodiment of the teaching, the cells of the battery pack unit may be nickel-metal hydride secondary cells. When the battery pack unit includes the cells that are nickel-metal hydride secondary cells, charging-induced temperature rises of the cells are noticeable. Thus, the testing method accurately detects an abnormality in the duct assembly.

According to yet another embodiment of the teaching, the battery pack unit, which serves as a test object, may further include a coolant supply device to supply the coolant to the duct assembly. In this embodiment, step a) preferably involves supplying the coolant to the duct assembly from the coolant supply device. Thus, the testing method according to this embodiment detects not only an abnormality caused by a malfunction of the duct assembly but also a failure caused by a malfunction of the coolant supply device.

A battery pack unit testing apparatus according to an embodiment of the teaching is configured to test a battery pack unit including: a battery pack including a plurality of cells electrically connected to each other; and a duct assembly through which a coolant is supplied to the cells of the battery pack. The testing apparatus includes: thermometers each attached to an associated one of the cells of the battery pack; a battery charger connected to the battery pack; and an abnormality detector. The abnormality detector includes: a first processor to cause the battery charger to charge the battery pack under predetermined conditions, while supplying the coolant to the duct assembly; a second processor to acquire temperature information on the cells from the thermometers at predetermined time intervals during the charging and coolant supplying process performed by the first processor; and a third processor to determine whether a difference between the highest and lowest ones of temperatures of the cells measured at substantially the same time is equal to or greater than a predetermined reference temperature difference on the basis of the temperature information acquired by the second processor. This testing apparatus detects a failure in the duct assembly.

DESCRIPTION OF THE PREFERRED EMBODIMENTS

A battery pack unit testing method according to an embodiment of the teaching will be described below.

Battery Pack Unit 10

Figure 1:
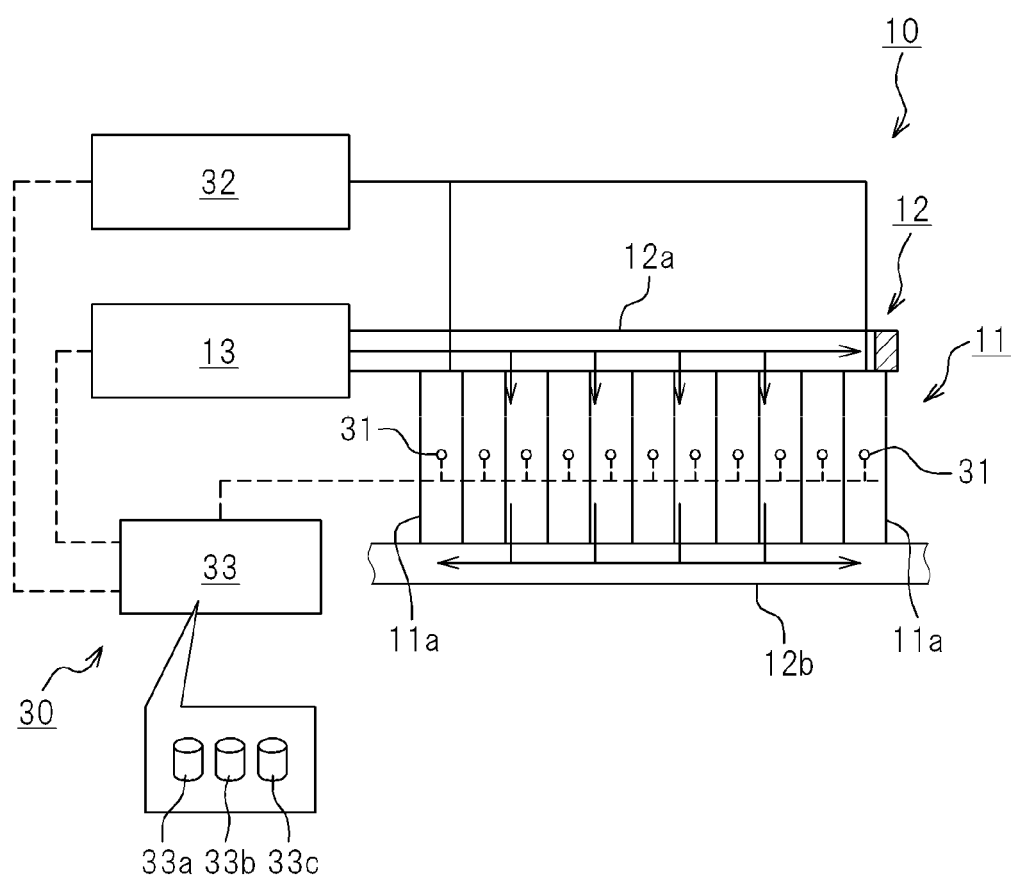
FIG. 1 is a schematic diagram illustrating a testing apparatus 30 configured to perform a testing method for a battery pack unit 10.

FIG. 1 is a schematic diagram illustrating a testing apparatus 30 configured to perform a testing method for a battery pack unit 10. The battery pack unit 10 serves as a test object. As illustrated in FIG. 1, the battery pack unit 10 according to this embodiment includes a battery pack 11, a duct assembly 12, and a coolant supply device 13.

Battery Pack 11

The battery pack 11 includes a plurality of cells 11a electrically connected to each other. Unless otherwise specified, the battery pack 11 is not limited to any particular configuration. In the embodiment illustrated in FIG. 1, the cells 11a are rectangular cells of the same type and stacked one on another in a row such that the widest flat surfaces of the adjacent cells 11a face each other. Terminals of the cells 11a of the battery pack 11 are electrically connected to each other, so that the cells 11a function as a single cell. Although not illustrated, spacers may be disposed between the cells 11a. The cells 11a, which are stacked one on another, may be bound together.

Duct Assembly 12

The duct assembly 12 includes a duct through which a coolant is supplied to the cells 11a of the battery pack 11. Although simplified in FIG. 1, the duct assembly 12 according to this embodiment includes: a supply duct 12a extending along first lateral surfaces of the cells 11a stacked one on another; and a discharge duct 12b extending along second lateral surfaces of the cells 11a opposite to the first lateral surfaces of the cells 11a. The supply duct 12a includes a plurality of openings. The coolant flows out of the supply duct 12a through these openings and then flows between the cells 11a adjacent to each other. The discharge duct 12b, extending along the second lateral surfaces of the cells 11a opposite to the first lateral surfaces of the cells 11a, collects the coolant that has flowed between the cells 11a. The duct assembly 12 is illustrated by way of example and not limitation in FIG. 1. The configuration of the duct assembly 12 may be changed as appropriate depending on the shapes and locations of the cells 11a of the battery pack 11. The duct assembly 12 is preferably configured to allow the coolant to be substantially uniformly supplied to the cells 11a of the battery pack 11 and thus enable the cells 11a of the battery pack 11 to be substantially uniformly cooled. The battery pack 11 may be provided in a package or housed in a case such that the duct assembly 12 is contained in the package or case. The duct assembly 12 having the configuration and functions just described is disclosed in Patent Document 1, for example.

Coolant Supply Device 13

The coolant supply device 13 supplies the coolant to the duct assembly 12. In this embodiment, air, for example, may be easily used as the coolant. When air is used as the coolant, the coolant supply device 13 is a blower. Although the battery pack unit 10 according to this embodiment includes the coolant supply device 13, the battery pack unit 10 does not necessarily have to include the coolant supply device 13. In one example, the coolant supply device 13 may be an external device not included in the battery pack unit 10 or a component of the testing apparatus 30. In other words, the coolant supply device 13 may be connected to or in communication with the duct assembly 12 during testing.

Failures in the battery pack unit 10 that may be detected are mainly as follows:

1. The duct assembly 12 is improperly attached to the battery pack 11, preventing the coolant from being suitably supplied to the cells 11a of the battery pack 11. For example, a portion of the supply duct 12a is detached from the battery pack 11;
2. The duct assembly 12 is clogged with foreign substances or particles, blocking the flow of the coolant or significantly reducing the flow rate of the coolant through the clogged portion of the duct assembly 12. In such a case, the cells 11a between which the coolant does not flow tend to increase in temperature;
3. The duct assembly 12 is not attached to the battery pack 11; and
4. A breakdown in the coolant supply device 13 stops the supply of the coolant to the duct assembly 12. The battery pack unit 10 according to this embodiment includes the coolant supply device 13, which enables detection of a failure resulting from a malfunction of the coolant supply device 13.

Using, for example, a laser sensor in a skillful manner may detect detachment of a portion of the supply duct 12a from the battery pack 11 and/or clogging of the duct assembly 12 with foreign substances or particles. In this case, however, the laser sensor has to be disposed skillfully for each battery pack unit, and in addition, an installation space for the laser sensor is limited. This complicates practical use of the laser sensor, making it difficult to accurately detect the failures mentioned above. The testing method disclosed herein and the testing apparatus 30 configured to perform this testing method will be described below.

Testing Apparatus 30

The testing apparatus 30 includes thermometers 31, a battery charger 32, and an abnormality detector 33.

Thermometer 31

Each thermometer 31 is attached to an associated one of the cells 11a of the battery pack 11 so as to measure the temperature of the associated cell 11a. The thermometers 31, which are attached to the cells 11a, may be intended for use with the testing apparatus 30 but are not limited to such use. For example, suppose that the battery pack 11 is used while the temperatures of the cells 11a are monitored. In such a case, the thermometers 31, which are attached to the cells 11a, serve to monitor the temperatures of the cells 11a during use of the battery pack 11. The thermometers 31 that are attached to the cells 11a and serve to monitor the temperatures of the cells 11a during use of the battery pack 11 are also usable with the testing apparatus 30.

Battery Charger 32

The battery charger 32 is connected to the battery pack 11 so as to charge the battery pack 11. The cells 11a of the battery pack 11 are substantially uniformly chargeable by the battery charger 32.

Abnormality Detector 33

The abnormality detector 33 according to this embodiment is electrically connected to the coolant supply device 13, the thermometers 31, and the battery charger 32. The abnormality detector 33 includes a memory and an arithmetic unit. The abnormality detector 33 performs predetermined processes in accordance with program(s) stored in advance in the memory. For example, the abnormality detector 33 acquires temperature information on the cells 11a from the thermometers 31 and stores the temperature information in the memory. The abnormality detector 33 controls the coolant supply device 13 and the battery charger 32.

The abnormality detector 33 causes the coolant supply device 13 to supply the coolant to the duct assembly 12, and causes the battery charger 32 to charge the battery pack 11 under predetermined conditions. The abnormality detector 33 acquires temperature information on the cells 11a from the thermometers 31 at predetermined time intervals during charging of the battery pack 11. On the basis of the temperature information acquired, the abnormality detector 33 determines whether a difference dt between the highest and lowest ones of the temperatures of the cells 11a measured at substantially the same time is equal to or greater than a predetermined reference temperature difference tx (i.e., whether dt≥tx). The abnormality detector 33 performs this determining process, thus detecting an abnormality in the battery pack unit 10.

Although the expression "difference dt between the highest and lowest ones of the temperatures measured at substantially the same time" is used herein, the temperatures of the cells 11a that are measured at different times in a strict sense may be regarded as the temperatures measured at "substantially the same time". For example, suppose that the temperatures of the cells 11a are indicated by the temperature information on the cells 11a recorded at substantially the same timing (or at substantially the same time) in the abnormality detector 33. In this case, if the actual times at which the temperatures of the cells 11a are measured are different in a strict sense, the temperatures of the cells 11a are regarded as the temperatures measured at "substantially the same time". More specifically, suppose that the temperature information on the cells 11a is acquired at different times due to processing conditions of the abnormality detector 33 (which may be a computer). In this case also, the temperatures of the cells 11a may be regarded as being measured at "substantially the same time". The term "substantially the same time" may refer to a time during which variations in temperatures of the cells 11a of the battery pack 11 are estimated. This means that the temperatures of the cells 11a may be measured substantially simultaneously. Thus, as long as the purpose of estimating variations in temperatures of the cells 11a is substantially accomplished, the temperatures of the cells 11a do not necessarily have to be measured at the same time in a strict sense. The term "substantially the same time" is used herein based on these definitions. The term "substantially the same time" in step c) of the testing method disclosed herein may be interpreted based on these definitions.

Abnormality Detecting Process

An abnormality detecting process to be performed by the testing apparatus 30 will be described below. The abnormality detector 33 causes the coolant supply device 13 to supply the coolant to the duct assembly 12, and causes the battery charger 32 to charge the battery pack 11 under predetermined conditions. Thus, the cells 11a of the battery pack 11 are substantially uniformly charged by the battery charger 32. The temperatures of the cells 11a of the battery pack 11, which are uniformly charged, may vary.

Figure 2:
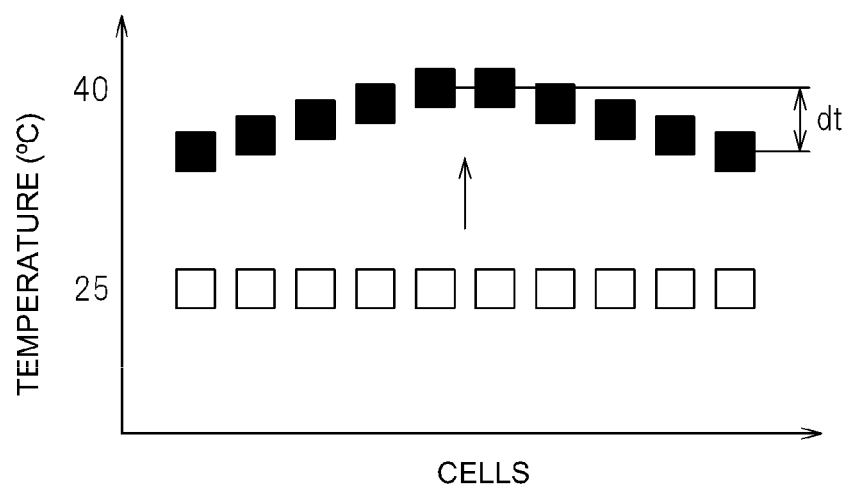
FIG. 2 is a graph schematically illustrating temperature distributions of a battery pack 11.

FIG. 2 is a graph schematically illustrating temperature distributions of the battery pack 11. In FIG. 2, the temperatures of the cells 11a of the battery pack 11 are sequentially plotted along the horizontal axis of the graph corresponding to the direction in which the cells 11a are stacked in a row as illustrated in FIG. 1. The white plots in FIG. 2 indicate the temperature distribution obtained before charging of the battery pack 11. The black plots in FIG. 2 indicate temperature distribution obtained during charging of the battery pack 11 for which the duct assembly 12 does not function.

In FIG. 2, for the sake of convenience, ten plots are depicted along the horizontal axis for each temperature distribution. In FIG. 2, ten cells are selected evenly from the cells 11a stacked one on another in the battery pack 11, and the temperatures of the ten cells are sequentially plotted along the horizontal axis corresponding to the direction in which the cells 11a are stacked one on another. Thus, the plots in the horizontal center of the graph represent the temperatures of the cells 11a in the center of the battery pack 11, and the plots at the horizontal ends of the graph represent the temperatures of the cells 11a at the ends of the battery pack 11.

As indicated by the black plots in FIG. 2, during charging of the battery pack 11, the temperatures of the cells 11a in the center of the battery pack 11 tend to be higher than the temperatures of the cells 11a at the ends of the battery pack 11. When the plurality of cells 11a are stacked one on another in a row as illustrated in FIG. 1, the cells 11a at the ends of the battery pack 11 are likely to release heat. In contrast, the cells 11a in the center of the battery pack 11 are likely to keep heat from escaping therefrom. Although battery packs may have various configurations, the configuration of the battery pack 11 illustrated in FIG. 1 may cause temperature rise differences between the cells 11a in the center of the battery pack 11 and the cells 11a at the ends of the battery pack 11 during charging of the battery pack 11.

Figure 3:
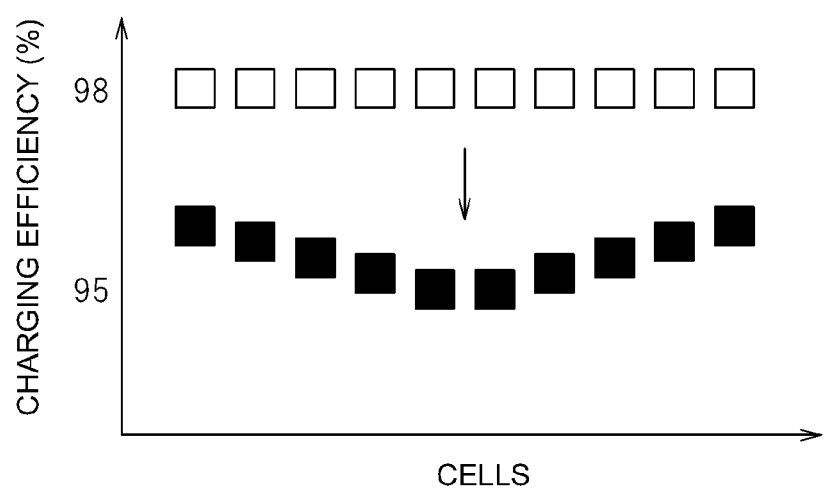
FIG. 3 is a graph schematically illustrating a charging efficiency distribution.

Such temperature differences lead to variations in charging efficiency. FIG. 3 is a graph schematically illustrating a charging efficiency distribution. The white plots in FIG. 3 indicate the charging efficiency distribution obtained when the temperatures of the cells 11a do not vary. The black plots in FIG. 3 indicate the charging efficiency distribution obtained when the temperatures of the cells 11a vary as illustrated in FIG. 2. As indicated by the black plots in FIG. 3, the charging efficiency of the cells 11a in the center of the battery pack 11 is low during charging of the battery pack 11. This is because charging of the battery pack 11 makes the temperatures of the cells 11a in the center of the battery pack 11 higher than the temperatures of the cells 11a at the ends of the battery pack 11.

Figure 4:
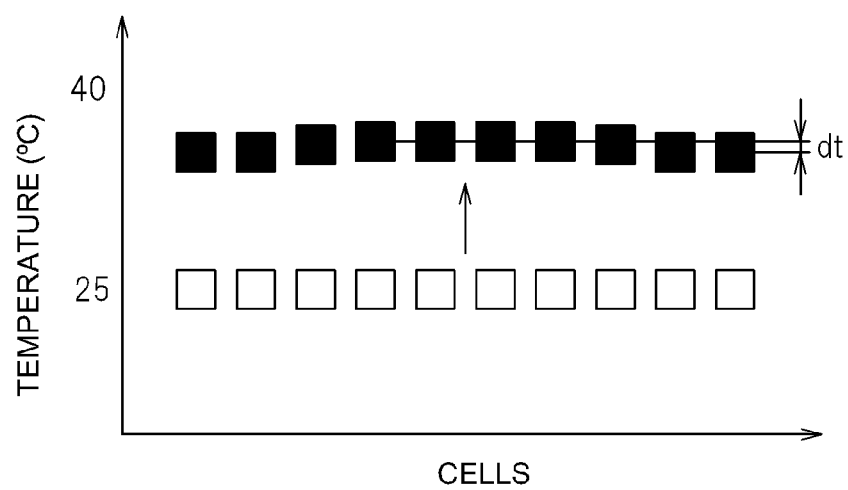
FIG. 4 is a graph schematically illustrating temperature distributions of the battery pack 11.

FIG. 4 is a graph schematically illustrating temperature distributions of the battery pack 11. The black plots in FIG. 4 indicate the temperature distribution of the cells 11a obtained during charging of the battery pack 11 for which the duct assembly 12 functions. The white plots in FIG. 4 indicate the temperature distribution of the cells 11a obtained before charging of the battery pack 11. When the duct assembly 12 functions properly, the cells 11a of the battery pack 11 are substantially uniformly cooled. Thus, as illustrated in FIG. 4, the temperature variations of the cells 11a are small. Such small temperature variations result in small variations in charging efficiency.

The abnormality detector 33 mainly serves to detect whether the duct assembly 12 is functioning properly. The abnormality detector 33 includes a first processor 33a, a second processor 33b, and a third processor 33c, which will be described below.

The first processor 33a causes the battery charger 32 to charge the battery pack 11 under predetermined conditions, while supplying the coolant to the duct assembly 12. In this embodiment, the first processor 33a causes the coolant supply device 13 to supply the coolant to the duct assembly 12, so that the battery pack 11 is charged while being cooled.

At predetermined time intervals during the charging and coolant supplying process performed by the first processor 33a, the second processor 33b acquires temperature information on the cells 11a measured by the thermometers 31. For example, the second processor 33b preferably stores the temperatures of the cells 11a in the memory of the abnormality detector 33 at predetermined time intervals.

On the basis of the temperature information acquired by the second processor 33b, the third processor 33c determines whether the difference dt between the highest and lowest ones of the temperatures of the cells 11a measured at substantially the same time is equal to or greater than the predetermined reference temperature difference tx. In other words, the third processor 33c determines whether the range of temperature variations of the cells 11a (which is represented by dt) is equal to or greater than the predetermined reference temperature difference tx (i.e., whether dt≥tx) on the basis of the temperature information acquired by the second processor 33b.

Because the battery pack unit 10 according to this embodiment includes the coolant supply device 13, the abnormality detector 33 detects not only an abnormality caused by a malfunction of the duct assembly 12 but also a failure caused by a malfunction of the coolant supply device 13. When the coolant supply device 13 and the duct assembly 12 function properly in the series of processes described above, the first processor 33a charges the battery pack 11 while cooling the battery pack 11. This reduces the temperature variations of the cells 11a of the battery pack 11 as illustrated in FIG. 4. In contrast, when the coolant supply device 13 or the duct assembly 12 malfunctions, the temperature variations of the cells 11a of the battery pack 11 increase. For example, suppose that proper supply of the coolant to the duct assembly 12 is prevented by a breakdown in the coolant supply device 13 or that the duct assembly 12 is detached from the battery pack 11. In such a case, the temperatures of the cells 11a in the center of the battery pack 11, which are detected, are high as illustrated in FIG. 2. Although not illustrated, clogging of a portion of the duct assembly 12 prevents proper supply of the coolant to some of the cells 11a. This results in increases in temperatures of the cells 11a to which the coolant is not properly supplied. The third processor 33c determines whether the range of temperature variations of the cells 11a (which is represented by dt) is equal to or greater than the predetermined reference temperature difference tx (i.e., whether dt≥tx) on the basis of the temperature information acquired by the second processor 33b. Consequently, the battery pack unit 10 may be determined to be in an abnormal condition when the temperatures of the cells 11a in the center of the battery pack 11 are noticeably higher than the temperatures of the cells 11a at the ends of the battery pack 11 (see FIG. 2) or when the temperatures of some of the cells 11a of the battery pack 11 are noticeably higher than the temperatures of the other cells 11a of the battery pack 11.

Flow Chart

Figure 5:
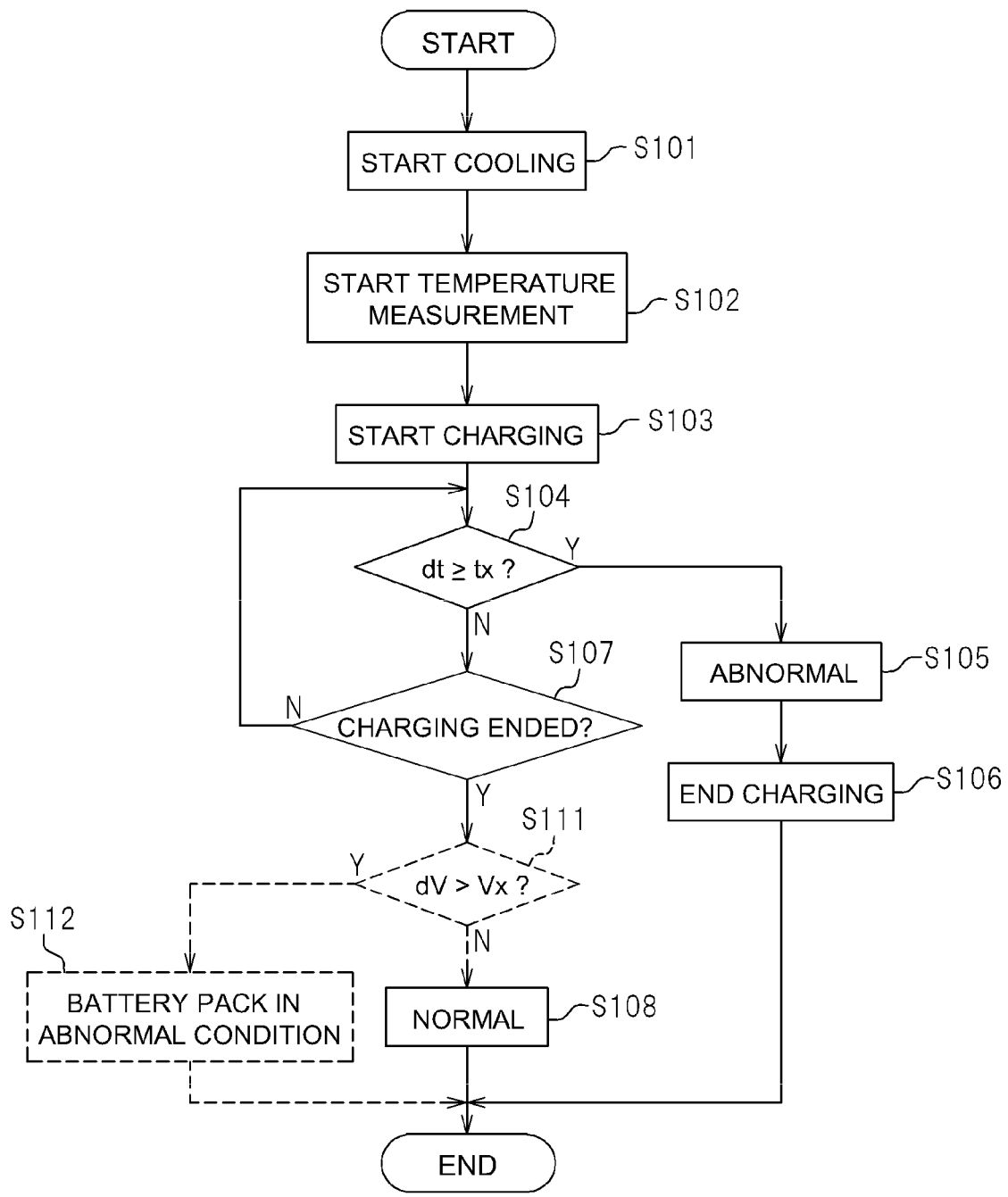
FIG. 5 is a flow chart of the testing method.

FIG. 5 is a flow chart of the battery pack unit testing method to be performed by the abnormality detector 33. The flow chart of FIG. 5 is provided by way of example only. Unless otherwise specified, the battery pack unit testing method disclosed herein is not limited to the flow chart of FIG. 5.

First, in step S101, the abnormality detector 33 starts cooling the battery pack 11. In the embodiment illustrated in FIG. 1, the abnormality detector 33 activates the coolant supply device 13 so as to supply the coolant to the duct assembly 12. For example, when the coolant supply device 13 is a blower, air is supplied to the duct assembly 12. Thus, with the coolant supply device 13 and the duct assembly 12 functioning properly, the cooling of the cells 11a of the battery pack 11 starts. The abnormality detector 33 preferably causes the coolant supply device 13 to operate under predetermined conditions. For example, when the coolant supply device 13 is a blower, the output of the blower is preferably set in advance.

In step S102, the abnormality detector 33 starts measuring the temperatures of the cells 11a. This means that the abnormality detector 33 starts acquiring temperature information on the cells 11a of the battery pack 11 before charging of the battery pack 11 starts. This allows reliable measurement of the temperatures of the cells 11a of the battery pack 11 for which charging has been started. Although the abnormality detector 33 according to this embodiment starts acquiring temperature information on the cells 11a before charging of the battery pack 11 starts, the abnormality detector 33 may alternatively start acquiring temperature information on the cells 11a before cooling of the battery pack 11 starts.

In step S103, the abnormality detector 33 starts charging the battery pack 11. The abnormality detector 33 preferably causes the battery charger 32 to charge the battery pack 11 under predetermined conditions. For example, one of the predetermined charging conditions is that the battery pack 11 be charged with a constant current for a predetermined period of time.

In accordance with the flow chart of the testing method, charging of the battery pack 11 starts after the coolant is supplied to the duct assembly 12 (or after cooling of the battery pack 11 is started). This means that cooling of the battery pack 11 starts before charging of the battery pack 11 starts. Thus, with the coolant supply device 13 and the duct assembly 12 functioning properly, the cells 11a are cooled before charging of the cells 11a. Accordingly, if, for any cause, the temperatures of the cells 11a vary before the start of cooling of the cells 11a, the temperature variations of the cells 11a will be small. In other words, temperature variations measured during charging of the battery pack 11 are charging-induced temperature variations. This enables reliable measurement of temperature variations of the cells 11a, with the coolant supply device 13 and the duct assembly 12 functioning properly. Consequently, the threshold value for the determining process is set easily, thus increasing testing accuracy.

In a preferable example, the abnormality detector 33 according to this embodiment starts charging the battery pack 11 after supplying the coolant to the duct assembly 12 (or after starting cooling of the battery pack 11). The testing method disclosed herein is not limited to this example. In another example, the abnormality detector 33 may cool and charge the battery pack 11 simultaneously. In still another example, the abnormality detector 33 may start cooling the battery pack 11 after a short delay (e.g., a delay of about one second) from charging of the battery pack 11.

Because the abnormality detector 33 starts temperature measurement in step S102, the abnormality detector 33 acquires temperature information on the cells 11a from the thermometers 31 during charging of the battery pack 11 in step S103. The temperature information on the cells 11a is stored at predetermined time intervals in the memory of the abnormality detector 33. In step S104, the abnormality detector 33 determines whether the difference dt between the highest and lowest ones of the temperatures of the cells 11a is equal to or greater than the predetermined reference temperature difference tx (i.e., whether dt≥tx) on the basis of the temperature information acquired. More specifically, the determining process of step 104 involves determining whether the difference dt between the highest and lowest ones of the temperatures of the cells 11a measured at substantially the same time is equal to or greater than the predetermined reference temperature difference tx on the basis of the temperature information acquired after the start of charging of the battery pack 11.

When the determination in step S104 is that the difference dt between the highest and lowest ones of the temperatures of the cells 11a is equal to or greater than the predetermined reference temperature difference tx (which means that dt≥tx), i.e., when the answer is Yes in step S104, the abnormality detector 33 determines the battery pack unit 10 to be in an abnormal condition in step S105. In this case, the abnormality detector 33 preferably ends charging of the battery pack 11 in step S106, thus concluding the testing method. When the determination in step S104 is that the difference dt between the highest and lowest ones of the temperatures of the cells 11a is not equal to or greater than the predetermined reference temperature difference tx (which means that dt<tx), i.e., when the answer is No in step S104, the abnormality detector 33 determines in step S107 whether charging of the battery pack 11 has been ended. When the determination in step S107 is that charging of the battery pack 11 has not been ended, i.e., when the answer is No in step S107, the abnormality detector 33 performs the determining process of step S104 again on the basis of the temperature information on the cells 11a that has been acquired at subsequent time(s). When the determination in step S107 is that charging of the battery pack 11 has been ended, i.e., when the answer is Yes in step S107, the abnormality detector 33 determines the battery pack unit 10 to be in a normal condition in step S108. The abnormality detector 33 repeats the determining process of step S104 until the abnormality detector 33 determines the battery pack unit 10 to be in an abnormal condition or determines that the battery pack 11 has been charged to a predetermined level.

Testing Timing

In this embodiment, the purpose of the testing method is to detect an abnormality in the duct assembly 12 of the battery pack unit 10. The testing method is predicated on the fact that charging the cells 11a of the battery pack 11 under predetermined conditions causes the cells 11a to generate heat under substantially the same conditions. Accordingly, this testing method is preferably performed at some time between completion of assembly of the battery pack unit 10 and shipment of the battery pack unit 10. This testing method is particularly suited for testing prior to shipment of the battery pack unit 10. This is because prior to shipment of the battery pack unit 10, usage conditions of the cells 11a of the battery pack unit 10 are controllable, thus enabling estimation of how the temperatures of the cells 11a of the battery pack 11 will be changed by charging the battery pack 11 under predetermined conditions. In other words, because the cells 11a of the battery pack unit 10 do not degrade before shipment, charging-induced temperature rises of the cells 11a occur in substantially the same way. Consequently, the duct assembly 12 is tested for a failure with higher accuracy.

As used herein, the expression "prior to shipment of the battery pack 11" and the expression "prior to shipment of the battery pack unit 10" each refer to a situation in which usage conditions of the battery pack 11 are controlled, for example, in a factory such that the temperatures of the cells 11a during charging of the battery pack 11 are predictable. For example, suppose that the battery pack unit 10 is shipped after being installed on a vehicle. In such a case, assuming that usage conditions of the battery pack 11 are controllable such that how the cells 11a will generate heat during charging is predictable, the expression "prior to shipment of the battery pack 11" and the expression "prior to shipment of the battery pack unit 10" may each refer to a situation where the vehicle on which the battery pack unit 10 is installed is yet to be shipped from a factory. Because usage conditions of the battery pack unit 10 are controlled, for example, in a factory as mentioned above, the expression "prior to shipment of the battery pack 11" and the expression "prior to shipment of the battery pack unit 10" may each refer to a situation in which the temperatures of the cells 11a during charging are predictable. The coolant supply device 13 and the duct assembly 12 are tested for failures with higher accuracy by performing the testing method disclosed herein in a situation in which the temperatures of the cells 11a during charging are predictable. In one example, charging of the battery pack 11 started by the abnormality detector 33 may be initial charging of the battery pack 11.

The testing method disclosed herein, which is to be performed by the testing apparatus 30, may be summarized as follows. The testing method disclosed herein mainly includes:

a) charging the battery pack 11 under predetermined conditions while supplying the coolant to the duct assembly 12;

b) acquiring temperature information on the cells 11a at predetermined time intervals during step a); and c) determining whether the difference dt between the highest and lowest ones of the temperatures of the cells 11a measured at substantially the same time is equal to or greater than the predetermined reference temperature difference tx on the basis of the temperature information acquired in step b).

For example, in the flow chart of FIG. 5, step a) is equivalent to steps S101 and S103, step b) is equivalent to step S102, and step c) is equivalent to step S104.

This testing method detects an abnormality in the duct assembly 12 of the battery pack unit 10 as described above. When the battery pack unit 10, which serves as a test object, includes the coolant supply device 13, step a) preferably involves supplying the coolant to the duct assembly 12 from the coolant supply device 13 of the battery pack unit 10. This enables detection of not only an abnormality caused by a malfunction of the duct assembly 12 but also a failure caused by a malfunction of the coolant supply device 13.

The findings of the inventor suggest that the charging conditions in step a) are preferably set such that mechanically distinguishable differences are observable between temperature variations of the cells 11a of the battery pack 11, which is not being cooled, and temperature variations of the cells 11a of the battery pack 11, which is being suitably cooled, for example. The difference dt between the highest and lowest ones of the temperatures of the cells 11a of the battery pack 11 measured at substantially the same time is estimated by determining temperature variations of the cells 11a of the battery pack 11. The charging conditions are preferably set such that significant degradation in the cells 11a caused by excessive charging is prevented. For example, the charging conditions in step a) are preferably set such that temperature variations of the cells 11a of the battery pack 11, which is not being cooled, are in the neighborhood of 3° C. (e.g., between 2.8° C. and 4° C. inclusive). Such conditions are appropriately set in accordance with the configurations of the battery pack 11 and the cells 11a.

The predetermined reference temperature difference tx in step c) is preferably set to be between 1.7° C. and 2.3° C. inclusive and more preferably set to be 2° C., for example. Step c) involves determining whether the difference dt between the highest and lowest ones of the temperatures of the cells 11a measured at substantially the same time is equal to or greater than the predetermined reference temperature difference tx on the basis of the temperature information acquired in step b), thus detecting a failure in the coolant supply device 13 or the duct assembly 12. Performing the testing method under the conditions mentioned above enables detection of a failure in the coolant supply device 13 or the duct assembly 12 without applying excessive loads to the cells 11a of the battery pack unit 10.

TABLE 1

| Test Example | 1 | 2 | 3 | 4 | 5 | 6 |
|---|---|---|---|---|---|---|
| Initial State | SOC 0% | SOC 0% | SOC 0% | SOC 20% | SOC 20% | SOC 20% |
| Charging Conditions | CC (38 A for 415 sec.) | CC (38 A for 428 sec.) | CC (38 A for 428 sec.) | CC (30 A for 535 sec.) | CC (38 A for 428 sec.) | CC (38 A for 415 sec.) |
| Work Temperature | 5° C. | 25° C. | 35° C. | 5° C. | 25° C. | 35° C. |
| Air Conditioning | 20° C. | 25° C. | 25° C. | 20° C. | 25° C. | 25° C. |
| Cooling | ON | ON | ON | ON | ON | ON |
| Cell Temperature Difference | 0.69° C. | 1.18° C. | 1.20° C. | 0.81° C. | 1.07° C. | 1.22° C. |

The above conditions may be set for any seasonal temperature environment. The inventor conducted various tests on battery pack units prepared as described below. A plurality of nickel-metal hydride secondary cells (e.g., 28 nickel-metal hydride secondary cells) were stacked one on another in a row so as to provide a battery pack. The battery pack was equipped with a duct assembly connected to or in communication with a coolant supply device, thus providing a battery pack unit. The battery pack unit thus provided and the components of the battery pack unit will be identified by the same reference signs as those used in FIG. 1. Table 1 provides data regarding Test Examples 1 to 6. For Test Examples 1 to 3, the battery pack 11 was provided by a set of the cells 11a whose state of charge (SOC) was 0%. For Test Examples 4 to 6, the battery pack 11 was provided by a set of the cells 11a whose state of charge (SOC) was 20%.

In Test Example 1, the temperature of the battery pack 11 at an initial stage of the test was 5° C., and the room temperature was 20° C., assuming that the test was carried out in a factory during winter in Japan. Step a) of Test Example 1 involved continuously charging the battery pack 11 with a constant current of 38 A for 415 seconds while supplying air to the duct assembly 12 from a blower functioning as the coolant supply device 13. As a result, the difference dt between the highest and lowest ones of the temperatures of the cells 11a in the battery pack unit 10 was 0.69° C.

In Test Example 2, the temperature of the battery pack 11 at an initial stage of the test was 25° C., and the room temperature was 25° C., assuming that the test was carried out in a factory during spring or autumn in Japan. Step a) of Test Example 2 involved continuously charging the battery pack 11 with a constant current of 38 A for 428 seconds while supplying air to the duct assembly 12 from the blower functioning as the coolant supply device 13. As a result, the difference dt between the highest and lowest ones of the temperatures of the cells 11a in the battery pack unit 10 was 1.18° C. When the test was conducted under the same conditions except that no air was supplied to the duct assembly 12, the difference dt was 2.98° C.

In Test Example 3, the temperature of the battery pack 11 at an initial stage of the test was 35° C., and the room temperature was 25° C., assuming that the test was carried out in a factory during summer in Japan. Step a) of Test Example 3 involved continuously charging the battery pack 11 with a constant current of 38 A for 428 seconds while supplying air to the duct assembly 12 from the blower functioning as the coolant supply device 13. As a result, the difference dt between the highest and lowest ones of the temperatures of the cells 11a in the battery pack unit 10 was 1.20° C.

In Test Example 4, the temperature of the battery pack 11 at an initial stage of the test was 5° C., and the room temperature was 20° C. Step a) of Test Example 4 involved continuously charging the battery pack 11 with a constant current of 30 A for 535 seconds while supplying air to the duct assembly 12 from the blower functioning as the coolant supply device 13. As a result, the difference dt between the highest and lowest ones of the temperatures of the cells 11a in the battery pack unit 10 was 0.81° C.

In Test Example 5, the temperature of the battery pack 11 at an initial stage of the test was 25° C., and the room temperature was 25° C. Step a) of Test Example 5 involved continuously charging the battery pack 11 with a constant current of 38 A for 428 seconds while supplying air to the duct assembly 12 from the blower functioning as the coolant supply device 13. As a result, the difference dt between the highest and lowest ones of the temperatures of the cells 11a in the battery pack unit 10 was 1.07° C.

In Test Example 6, the temperature of the battery pack 11 at an initial stage of the test was 35° C., and the room temperature was 25° C. Step a) of Test Example 6 involved continuously charging the battery pack 11 with a constant current of 38 A for 415 seconds while supplying air to the duct assembly 12 from the blower functioning as the coolant supply device 13. As a result, the difference dt between the highest and lowest ones of the temperatures of the cells 11a in the battery pack unit 10 was 1.22° C.

Test Examples 1 to 6 revealed that an average value AVE (arithmetic mean) of the differences dt between the highest and lowest ones of the temperatures of the cells 11a was 1.03° C. for the battery pack units 10 that were found to have no abnormalities in the coolant supply devices 13 or the duct assemblies 12 (i.e., the battery pack units 10 that were found to be non-defective). A standard deviation σ in each of Test Examples 1 to 6 was 0.225. The highest temperature difference was 1.22, which was observed in Test Example 6. The sum of the average value AVE and the standard deviation σ multiplied by a factor of three (i.e., AVE+3σ) was about 1.70° C. Thus, the predetermined reference temperature difference tx in step c) is preferably at least equal to or greater than 1.70° C. so as to enable detection of an abnormality in the coolant supply device 13 or the duct assembly 12. In order to prevent application of excessive loads to the cells 11a, the charging conditions are preferably set so that the difference dt between the highest and lowest ones of the temperatures of the cells 11a is in the neighborhood of 3° C. (e.g., between 2.8° C. and 4° C. inclusive) for the battery pack unit 10 that has an abnormality in the coolant supply device 13 or the duct assembly 12 (i.e., the battery pack unit 10 that is defective). With such charging conditions, the predetermined reference temperature difference tx in step c) is preferably set to be equal to or lower than 2.3° C. (e.g., 2° C.). Setting the predetermined reference temperature difference tx in step c) in this manner enables accurate detection of an abnormality in the battery pack unit 10.

If the testing method is carried out in different temperature environments and/or the initial temperatures of the battery pack units 10 serving as test objects differ, temperature rise variations of the cells 11a will be kept within about 1.2° C. as long as the coolant supply device 13 and the duct assembly 12 function properly. In contrast, if the coolant supply device 13 or the duct assembly 12 malfunctions, temperature rise variations of the cells 11a will be about 3° C. Accordingly, the predetermined reference temperature difference tx in step c) is set to be between 1.7° C. and 2.3° C. inclusive, thus enabling accurate detection of an abnormality caused by a malfunction of the coolant supply device 13 or the duct assembly 12.

The testing method for the battery pack unit 10 may further include d) detecting an abnormality in the battery pack 11 on the basis of charging-dependent information on the cells 11a of the battery pack 11 other than temperature information on the cells 11a of the battery pack 11. The addition of step d) enables detection of an abnormality in the battery pack 11. Thus, if the abnormality detector 33 detects no abnormality in the coolant supply device 13 or the duct assembly 12, the abnormality detector 33 may detect an abnormality in the battery pack 11. In this case, an abnormality in the coolant supply device 13 or the duct assembly 12 is discriminated from an abnormality in the battery pack 11. This allows the abnormality detector 33 to detect an abnormality in the coolant supply device 13 or the duct assembly 12 with higher accuracy.

The battery pack unit 10 according to this embodiment includes the coolant supply device 13. The testing method for the battery pack unit 10 detects an abnormality in the coolant supply device 13 or the duct assembly 12. Alternatively, the battery pack unit 10 may include no coolant supply device 13. In other words, the coolant supply device 13 may be an external device not included in the battery pack unit 10 or a component of the testing apparatus 30. In such a case, the coolant supply device 13 is temporarily connected to or in communication with the duct assembly 12 during testing. The testing method for the battery pack unit 10 is performed mainly to detect an abnormality caused by a malfunction of the duct assembly 12.

The broken lines in FIG. 5 represent optional step d). For example, step d), which aims at detecting an abnormality in the battery pack 11, involves acquiring information related to open circuit voltages of the cells 11a prior to and subsequent to the charging process of step a) using voltmeters (not illustrated) attached to the cells 11a of the battery pack 11. Step d) further involves calculating a difference dV between the highest and lowest ones of voltage rises of the cells 11a on the basis of the open circuit voltage-related information acquired. Referring to FIG. 5, in step S111, the abnormality detector 33 determines whether the voltage rise difference dV is greater than a predetermined allowable value Vx (i.e., whether dV>Vx). When the determination in step S111 is that the voltage rise difference dV is greater than the predetermined allowable value Vx, i.e., when the answer is Yes in step S111, the abnormality detector 33 determines the battery pack 11 to be in an abnormal condition in step S112. When the determination in step S111 is that the voltage rise difference dV is equal to or smaller than the predetermined allowable value Vx, i.e., when the answer is No in step S111, the abnormality detector 33 determines the battery pack 11 to be in a normal condition in step S108. The testing method may include step d), which aims at detecting an abnormality in the battery pack 11 as just described. The abnormality detector 33 of the testing apparatus 30 that performs the testing method including step d) is preferably configured to detect an abnormality in the battery pack 11 on the basis of charging-dependent information on the cells 11a of the battery pack 11 other than temperature information on the cells 11a of the battery pack 11.

Step d), which aims at detecting an abnormality in the battery pack 11, is performed using information related to the open circuit voltages of the cells 11a. Alternatively, step d) may be performed using any other information that is charging-dependent information on the cells 11a of the battery pack 11 but not temperature information on the cells 11a of the battery pack 11 and that may be used in detecting an abnormality in the battery pack 11.

The testing method disclosed herein is suitable for a battery pack unit including secondary cells that generate heat during charging. For example, when the battery pack unit 10 includes the cells 11a that are nickel-metal hydride secondary cells, this battery pack unit 10 will be a suitable test object. This is because when the battery pack unit 10 includes the cells 11a that are nickel-metal hydride secondary cells, charging-induced temperature rises of the cells 11a are noticeable, and thus the testing method detects an abnormality in the coolant supply device 13 or the duct assembly 12 with high accuracy.

The battery pack unit testing method disclosed herein and the testing apparatus configured to perform the testing method have been described thus far. Unless otherwise specified, the testing method disclosed herein and the testing apparatus configured to perform the testing method are not limited to the above-described embodiment.

What is claimed is:
1. A battery pack unit testing method for a battery pack unit, the battery pack unit comprising:
　a battery pack including a plurality of cells electrically connected to each other;
　a plurality of thermometers, wherein each one of the thermometers is attached to each one of the plurality of cells of the battery pack, respectively; and
　a duct assembly through which a coolant is supplied to the cells of the battery pack,
the battery pack unit testing method comprising:
　a) charging the battery pack while supplying the coolant to the duct assembly at a time between completion of assembly of the battery pack unit and shipment of the battery pack unit;
　b) acquiring, by the thermometers, temperature information of each of the cells at predetermined time intervals during charging of the battery pack while supplying the coolant to the duct assembly;
　c1) amongst all of the cells of the battery pack, determining a highest temperature information and a lowest temperature information measured at the same time on the basis of the temperature information acquired during charging of the battery pack while supplying the coolant to the duct assembly;

c2) calculating a difference between the highest temperature information and the lowest temperature information amongst all of the cells;
c3) determining whether the difference is equal to or greater than a predetermined reference temperature difference; and
c4) based upon the difference being equal to or greater than the predetermined reference temperature difference, determining that the duct assembly has a malfunction.

2. The battery pack unit testing method according to claim 1, wherein
step a) involves starting the charging of the battery pack after starting supplying the coolant to the duct assembly.

3. The battery pack unit testing method according to claim 1, wherein
the charging of the battery pack in step a) is initial charging of the battery pack.

4. The battery pack unit testing method according to claim 1, wherein
the reference temperature difference in step c3) is between 1.7° C. and 2.3° C. inclusive.

5. The battery pack unit testing method according to claim 1, further comprising d) detecting an abnormality in the battery pack on the basis of charging-dependent information on the cells of the battery pack other than the temperature information on the cells of the battery pack.

6. The battery pack unit testing method according to claim 1, wherein
the cells of the battery pack unit are nickel-metal hydride secondary cells.

7. A battery pack unit testing method for a battery pack unit,
the battery pack unit comprising:
a battery pack including a plurality of cells electrically connected to each other,
a plurality of thermometers, wherein each one of the thermometers is attached to each one of the plurality of cells of the battery pack, respectively; and
a duct assembly through which a coolant is supplied to the cells of the battery pack; and
a coolant supply device to supply the coolant to the duct assembly,
the battery pack unit testing method comprising:
a) charging the battery pack while supplying the coolant to the duct assembly from the coolant supply device at a time between completion of assembly of the battery pack unit and shipment of the battery pack unit;
b) acquiring, by the thermometers, temperature information of each of the cells at predetermined time intervals during charging of the battery pack while supplying the coolant to the duct assembly;
c1) amongst all of the cells of the battery pack, determining a highest temperature information and a lowest temperature information measured at the same time on the basis of the temperature information acquired during charging of the battery pack while supplying the coolant to the duct assembly;
c2) calculating a difference between the highest temperature information and the lowest temperature information amongst all of the cells; and
c3) determining whether the difference is equal to or greater than a predetermined reference temperature difference; and
c4) based upon the difference being equal to or greater than the predetermined reference temperature difference, determining that the coolant supply device or the duct assembly has a malfunction.

8. A battery pack unit testing apparatus for a battery pack unit, wherein the battery pack unit comprises:
a battery pack including a plurality of cells electrically connected to each other; and a duct assembly through which a coolant is supplied to the cells of the battery pack, wherein the battery pack unit testing apparatus comprises:
a plurality of thermometers, wherein each one of the thermometers is attached to each one of the cells of the battery pack, respectively;
a battery charger connected to the battery pack; and
an abnormality detector,
the abnormality detector including:
a first processor to cause the battery charger to charge the battery pack, while supplying the coolant to the duct assembly at a time between completion of assembly of the battery pack unit and shipment of the battery pack, unit;
a second processor to acquire temperature information on the cells from the thermometers at predetermined time intervals during the charging and coolant supplying process performed by the first processor; and
a third processor configured to:
amongst all of the cells of the battery pack, determine a highest temperature information and a lowest temperature information measured at the same time on the basis of the temperature information acquired during charging of the battery pack while supplying the coolant to the duct assembly;
calculate a difference between the highest temperature information and the lowest temperature information amongst all of the cells;
determine whether the difference is equal to or greater than a predetermined reference temperature difference; and
based upon the difference being equal to or greater than the predetermined reference temperature difference, determine that the duct assembly has a malfunction.

* * * * *